United States Patent
Zhang

(10) Patent No.: US 11,223,023 B2
(45) Date of Patent: Jan. 11, 2022

(54) FOLDING DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Zhuo Zhang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 258 days.

(21) Appl. No.: 16/613,769

(22) PCT Filed: Sep. 20, 2019

(86) PCT No.: PCT/CN2019/106948
§ 371 (c)(1),
(2) Date: Nov. 14, 2019

(87) PCT Pub. No.: WO2020/237929
PCT Pub. Date: Dec. 3, 2020

(65) Prior Publication Data
US 2021/0343974 A1    Nov. 4, 2021

(30) Foreign Application Priority Data

May 27, 2019 (CN) .......................... 201910443693.4

(51) Int. Cl.
*H05K 7/02* (2006.01)
*H05K 7/04* (2006.01)
(Continued)

(52) U.S. Cl.
CPC ....... *H01L 51/5237* (2013.01); *H05K 5/0017* (2013.01); *H05K 5/0226* (2013.01); *H01L 2251/5338* (2013.01)

(58) Field of Classification Search
USPC ........................................................ 361/807
See application file for complete search history.

(56) References Cited

U.S. PATENT DOCUMENTS 10,838,467 B1 * 11/2020 Mehandjiysky .......... E05D 3/06
2010/0232100 A1   9/2010 Fukuma
(Continued)

FOREIGN PATENT DOCUMENTS

CN    101840247 A    9/2010
CN    108738258 A    11/2018
(Continued)

*Primary Examiner* — Hung S. Bui

(57) ABSTRACT

A folding display device is provided. 2N+2 cylindrical rotating shafts of the folding display device in a flattened state are arranged side by side and two adjacent cylindrical rotating shafts are in contact with each other. When the folding display device is in an externally bent state, a second layer has N cylindrical rotating shafts arranged side by side, a first layer has N+2 cylindrical rotating shafts arranged side by side, two adjacent cylindrical rotating shafts of the first layer are in contact with each other, N cylindrical rotating shafts of the second layer are stacked on N+2 cylindrical rotating shafts of the first layer and support the flexible display panel corresponding to the rotating shaft assembly, and N is a positive integer greater than or equal to 1.

18 Claims, 5 Drawing Sheets

(51) Int. Cl.
    *H01L 51/52*     (2006.01)
    *H05K 5/00*     (2006.01)
    *H05K 5/02*     (2006.01)

(56) References Cited

U.S. PATENT DOCUMENTS

| | | | |
|---|---|---|---|
| 2011/0000136 A1* | 1/2011 | Brun | E05D 11/0081 49/358 |
| 2015/0361696 A1 | 12/2015 | Tazbaz | |
| 2018/0136700 A1* | 5/2018 | Chen | E05D 7/00 |
| 2019/0090363 A1* | 3/2019 | Bi | H05K 5/0017 |

FOREIGN PATENT DOCUMENTS

| | | |
|---|---|---|
| CN | 109210071 A | 1/2019 |
| CN | 208804113 U | 4/2019 |
| JP | 2018132129 A | 8/2018 |
| WO | 2015191411 A1 | 12/2015 |

* cited by examiner

FOLDING DISPLAY DEVICE

FIELD OF INVENTION

The present disclosure relates to the field of display technologies, and more particularly to a folding display device.

BACKGROUND OF INVENTION

With the development of flexible display technologies, organic light emitting diode (OLED) has shown its great potential in flexible displays, its applications from fixed flexible display screens to foldable display screens, making screens have both large size and portable features.

In the foldable display screens, designs of rotating shafts directly affect force of flexible organic light emitting diode display screens during deployment and bending, thereby affecting service life of the flexible organic light emitting diode display screens. Because Ordinary rotating shafts only play a role of rotation, when applied to the flexible organic light emitting diode display screens, a length of the flexible organic light emitting diode display screen at the rotating shaft changes continuously with the rotation of the rotating shaft, and the flexible organic light emitting diode display screen at the rotating shaft indicates that the flexible organic light emitting diode display screen is continuously subjected to stress (tensile stress or compressive stress), which may cause damage to the flexible organic light emitting diode display screen.

SUMMARY OF INVENTION

An objective of an embodiment of the present disclosure is to provide a folding display device to solve issues that a length of a flexible display panel at a rotating shaft changes greatly when the folding display device is converted between an externally bent state and a flattened state, which may cause damage to the flexible display panel.

An embodiment of the present disclosure provides a folding display device. The folding display device includes a first support frame, a second support frame, a flexible display panel, a connecting assembly, and a rotating shaft assembly. The rotating shaft assembly is rotatably connected between the first support frame and the second support frame through the connecting assembly, the flexible display panel is fixed on the first support frame and the second support frame and covers the rotating shaft assembly, and the rotating shaft assembly includes 2N+2 cylindrical rotating shafts. 2N+2 cylindrical rotating shafts of the folding display device in a flattened state are arranged side by side and two adjacent cylindrical rotating shafts are in contact with each other. When the first support frame and the second support frame are rotated to be in two parallel opposite planes and the folding display device is in an externally bent state, 2N+2 cylindrical rotating shafts are divided into a first layer and a second layer stacked with each other, the second layer has N cylindrical rotating shafts arranged side by side, the first layer has N+2 cylindrical rotating shafts arranged side by side, two adjacent cylindrical rotating shafts of the first layer are in contact with each other, N cylindrical rotating shafts of the second layer are stacked on N+2 cylindrical rotating shafts of the first layer and support the flexible display panel corresponding to the rotating shaft assembly, N is a positive integer greater than or equal to 1. The folding display device further includes a metal sheet fixed to the first support frame and the second support frame and covering the rotating shaft assembly, and the flexible display panel is fixed to a surface of the metal sheet away from the rotating shaft assembly.

In an embodiment of the present disclosure, the rotating shaft assembly includes a first cylindrical rotating shaft, a second cylindrical rotating shaft, a third cylindrical rotating shaft, and a fourth cylindrical rotating shaft, the first cylindrical rotating shaft is rotatably connected with the first support frame, the fourth cylindrical rotating shaft is rotatably connected to the second support frame, the first cylindrical rotating shaft and the second cylindrical rotating shaft are rotatably connected by a first connecting rod, the third cylindrical rotating shaft and the fourth cylindrical rotating shaft is rotatably connected by a second connecting rod, the second cylindrical rotating shaft and the third cylindrical rotating shaft are connected by an elastic connecting rod, and a first gear disposed on the second cylindrical rotating shaft and a second gear disposed on the third cylindrical rotating shaft abut each other.

In an embodiment of the present disclosure, the rotating shaft assembly includes a first cylindrical rotating shaft, a second cylindrical rotating shaft, a third cylindrical rotating shaft, a fourth cylindrical rotating shaft, a fifth cylindrical rotating shaft, and a sixth cylindrical rotating shaft, the first cylinder rotating shaft is rotatably connected to the first support frame, the sixth cylindrical rotating shaft is rotatably connected to the second support frame, the first cylindrical rotating shaft and the second cylindrical rotating shaft is rotatably connected by a first connecting rod, the second cylindrical rotating shaft and the third cylindrical rotating shaft are rotatably connected by a first elastic connecting rod, a first gear disposed on the second cylindrical rotating shaft and a second gear disposed on the third cylindrical rotating shaft abut each other, the fifth cylindrical rotating shaft and the sixth cylindrical rotating shaft are rotatably connected by a second connecting rod, the fourth cylindrical rotating shaft and the fifth cylindrical rotating shaft are rotatably connected by a second elastic connecting rod, a third gear disposed on the fourth cylindrical rotating shaft and a fourth gear disposed on the fifth cylindrical rotating shaft abut each other, and the third cylindrical rotating shaft and the fourth cylindrical rotating shaft are rotatably connected by a third connecting rod.

In an embodiment of the present disclosure, each of the cylindrical rotating shafts includes a hollow rotating shaft body and two transmission rotating shafts, an end of one of the transmission rotating shafts is inserted into a cavity of an end of the hollow rotating shaft body, and an end of another of the transmission shafts is inserted into a cavity of another end of the hollow rotating shaft body.

In an embodiment of the present disclosure, the two transmission rotating shafts of one of the cylindrical rotating shafts and the first support frame are rotatably connected by two sets of first connecting members, the two sets of first connecting members are rotatably connected one-to-one with the two transmission rotating shafts of one of the cylindrical rotating shafts and connected to the first support frame detachably and fixedly, the two transmission rotating shafts of another of the cylindrical rotating shafts and the second support frame are rotatably connected by two sets of second connecting members, the two sets of second connecting members are rotatably connected one-to-one with the two transmission rotating shafts of another of the cylindrical rotating shafts and connected to the second support frame detachably and fixedly, and the connecting assembly includes the two sets of first connecting members and the two sets of second connecting members.

In an embodiment of the present disclosure, each set of the first connecting members includes a first connecting component and two second connecting components, each set of the second connecting members includes a third connecting component and two fourth connecting components, two ends of the first connecting component are detachably and fixedly connected to the two second connecting components, respectively, a middle of the first connecting component is detachably and fixedly connected to the first support frame, two ends of the third connecting component are detachably and fixedly connected to the two fourth connecting components, respectively, a middle of the third connecting component is detachably and fixedly connected to the second support frame, the two second components of each set of the first connecting members are rotatably connected to one of the transmission rotating shafts of the cylindrical rotating shaft, and the two fourth components of each set of the second connecting members are rotatably connected to another of the transmission rotating shafts of the cylindrical rotating shaft.

In an embodiment of the present disclosure, a middle of the first connecting component has a first connecting hole, a middle of the third connecting component has a second connecting hole, the first support frame has two first fixing slots and third connecting holes each disposed in each of the first fixing slots, the second support frame has two second fixing slots and fourth connecting holes each disposed in each of the second fixing slots, two sets of the first connecting members are respectively disposed in the two first fixing slots and pass through the first connecting hole and the third connecting hole by bolting through to detachably and fixedly connect the first connecting member and the first support frame, two sets of the second connecting members are respectively disposed in the two second fixing slots and pass through the second connecting hole and the fourth connecting hole by bolting through to detachably and fixedly connect the second connecting member and the second support frame.

In an embodiment of the present disclosure, each of the hollow rotating shaft bodies includes a first plane, a second plane, a third plane, and a curved surface, the curved surface is opposite to the first plane, the second plane is opposite to the third plane, the second plane is connected to an end of the first plane and the curved surface, and the third plane is connected to another end of the first plane and the curved surface.

In an embodiment of the present disclosure, 2N+2 of the hollow rotating shaft bodies are hollow cylinders.

An embodiment of the present disclosure further provides a folding display device. The folding display device includes a first support frame, a second support frame, a flexible display panel, a connecting assembly, and a rotating shaft assembly. The rotating shaft assembly is rotatably connected between the first support frame and the second support frame through the connecting assembly, the flexible display panel is fixed on the first support frame and the second support frame and covers the rotating shaft assembly, and the rotating shaft assembly includes 2N+2 cylindrical rotating shafts. 2N+2 cylindrical rotating shafts of the folding display device in a flattened state are arranged side by side and two adjacent cylindrical rotating shafts are in contact with each other. When the first support frame and the second support frame are rotated to be in two parallel opposite planes and the folding display device is in an externally bent state, 2N+2 cylindrical rotating shafts are divided into a first layer and a second layer stacked with each other, the second layer has N cylindrical rotating shafts arranged side by side, the first layer has N+2 cylindrical rotating shafts arranged side by side, two adjacent cylindrical rotating shafts of the first layer are in contact with each other, N cylindrical rotating shafts of the second layer are stacked on N+2 cylindrical rotating shafts of the first layer and support the flexible display panel corresponding to the rotating shaft assembly, N is a positive integer greater than or equal to 1. The folding display device further includes a metal sheet fixed to the first support frame and the second support frame and covering the rotating shaft assembly, and the flexible display panel is fixed to a surface of the metal sheet away from the rotating shaft assembly.

In an embodiment of the present disclosure, the rotating shaft assembly includes a first cylindrical rotating shaft, a second cylindrical rotating shaft, a third cylindrical rotating shaft, and a fourth cylindrical rotating shaft, the first cylindrical rotating shaft is rotatably connected with the first support frame, the fourth cylindrical rotating shaft is rotatably connected to the second support frame, the first cylindrical rotating shaft and the second cylindrical rotating shaft are rotatably connected by a first connecting rod, the third cylindrical rotating shaft and the fourth cylindrical rotating shaft is rotatably connected by a second connecting rod, the second cylindrical rotating shaft and the third cylindrical rotating shaft are connected by an elastic connecting rod, and a first gear disposed on the second cylindrical rotating shaft and a second gear disposed on the third cylindrical rotating shaft abut each other.

In an embodiment of the present disclosure, the rotating shaft assembly includes a first cylindrical rotating shaft, a second cylindrical rotating shaft, a third cylindrical rotating shaft, a fourth cylindrical rotating shaft, a fifth cylindrical rotating shaft, and a sixth cylindrical rotating shaft, the first cylinder rotating shaft is rotatably connected to the first support frame, the sixth cylindrical rotating shaft is rotatably connected to the second support frame, the first cylindrical rotating shaft and the second cylindrical rotating shaft is rotatably connected by a first connecting rod, the second cylindrical rotating shaft and the third cylindrical rotating shaft are rotatably connected by a first elastic connecting rod, a first gear disposed on the second cylindrical rotating shaft and a second gear disposed on the third cylindrical rotating shaft abut each other, the fifth cylindrical rotating shaft and the sixth cylindrical rotating shaft are rotatably connected by a second connecting rod, the fourth cylindrical rotating shaft and the fifth cylindrical rotating shaft are rotatably connected by a second elastic connecting rod, a third gear disposed on the fourth cylindrical rotating shaft and a fourth gear disposed on the fifth cylindrical rotating shaft abut each other, and the third cylindrical rotating shaft and the fourth cylindrical rotating shaft are rotatably connected by a third connecting rod.

In an embodiment of the present disclosure, each of the cylindrical rotating shafts includes a hollow rotating shaft body and two transmission rotating shafts, an end of one of the transmission rotating shafts is inserted into a cavity of an end of the hollow rotating shaft body, and an end of another of the transmission shafts is inserted into a cavity of another end of the hollow rotating shaft body.

In an embodiment of the present disclosure, the two transmission rotating shafts of one of the cylindrical rotating shafts and the first support frame are rotatably connected by two sets of first connecting members, the two sets of first connecting members are rotatably connected one-to-one with the two transmission rotating shafts of one of the cylindrical rotating shafts and connected to the first support frame detachably and fixedly, the two transmission rotating shafts of another of the cylindrical rotating shafts and the second support frame are rotatably connected by two sets of second connecting members, the two sets of second connecting members are rotatably connected one-to-one with the two transmission rotating shafts of another of the cylindrical rotating shafts and connected to the second support frame detachably and fixedly, and the connecting assembly includes the two sets of first connecting members and the two sets of second connecting members.

In an embodiment of the present disclosure, each set of the first connecting members includes a first connecting component and two second connecting components, each set of the second connecting members includes a third connecting component and two fourth connecting components, two ends of the first connecting component are detachably and fixedly connected to the two second connecting components, respectively, a middle of the first connecting component is detachably and fixedly connected to the first support frame, two ends of the third connecting component are detachably and fixedly connected to the two fourth connecting components, respectively, a middle of the third connecting component is detachably and fixedly connected to the second support frame, the two second components of each set of the first connecting members are rotatably connected to one of the transmission rotating shafts of the cylindrical rotating shaft, and the two fourth components of each set of the second connecting members are rotatably connected to another of the transmission rotating shafts of the cylindrical rotating shaft.

In an embodiment of the present disclosure, a middle of the first connecting component has a first connecting hole, a middle of the third connecting component has a second connecting hole, the first support frame has two first fixing slots and third connecting holes each disposed in each of the first fixing slots, the second support frame has two second fixing slots and fourth connecting holes each disposed in each of the second fixing slots, two sets of the first connecting members are respectively disposed in the two first fixing slots and pass through the first connecting hole and the third connecting hole by bolting through to detachably and fixedly connect the first connecting member and the first support frame, two sets of the second connecting members are respectively disposed in the two second fixing slots and pass through the second connecting hole and the fourth connecting hole by bolting through to detachably and fixedly connect the second connecting member and the second support frame.

In an embodiment of the present disclosure, each of the hollow rotating shaft bodies includes a first plane, a second plane, a third plane, and a curved surface, the curved surface is opposite to the first plane, the second plane is opposite to the third plane, the second plane is connected to an end of the first plane and the curved surface, and the third plane is connected to another end of the first plane and the curved surface.

In an embodiment of the present disclosure, 2N+2 of the hollow rotating shaft bodies are hollow cylinders.

Beneficial effects of an embodiment of the present disclosure are that, a folding display device is provided. The folding display device includes 2N+2 cylindrical rotating shafts. 2N+2 cylindrical rotating shafts of the folding display device in a flattened state are arranged side by side and two adjacent cylindrical rotating shafts are in contact with each other. When the folding display device is in an externally bent state, 2N+2 cylindrical rotating shafts are divided into a first layer and a second layer stacked with each other, the second layer has N cylindrical rotating shafts arranged side by side, the first layer has N+2 cylindrical rotating shafts arranged side by side, two adjacent cylindrical rotating shafts of the first layer are in contact with each other, N cylindrical rotating shafts of the second layer are stacked on N+2 cylindrical rotating shafts of the first layer and support the flexible display panel corresponding to the rotating shaft assembly, and N is a positive integer greater than or equal to 1. When the folding display device changes between the flattened state and the externally bent state, a change of a length of a corresponding flexible display panel at the rotating shaft assembly is small, such that a stress of the flexible display panel during the change is reduced, and the flexible display panel is avoided to be damaged.

DETAILED DESCRIPTION OF PREFERRED EMBODIMENTS

Figure 1:
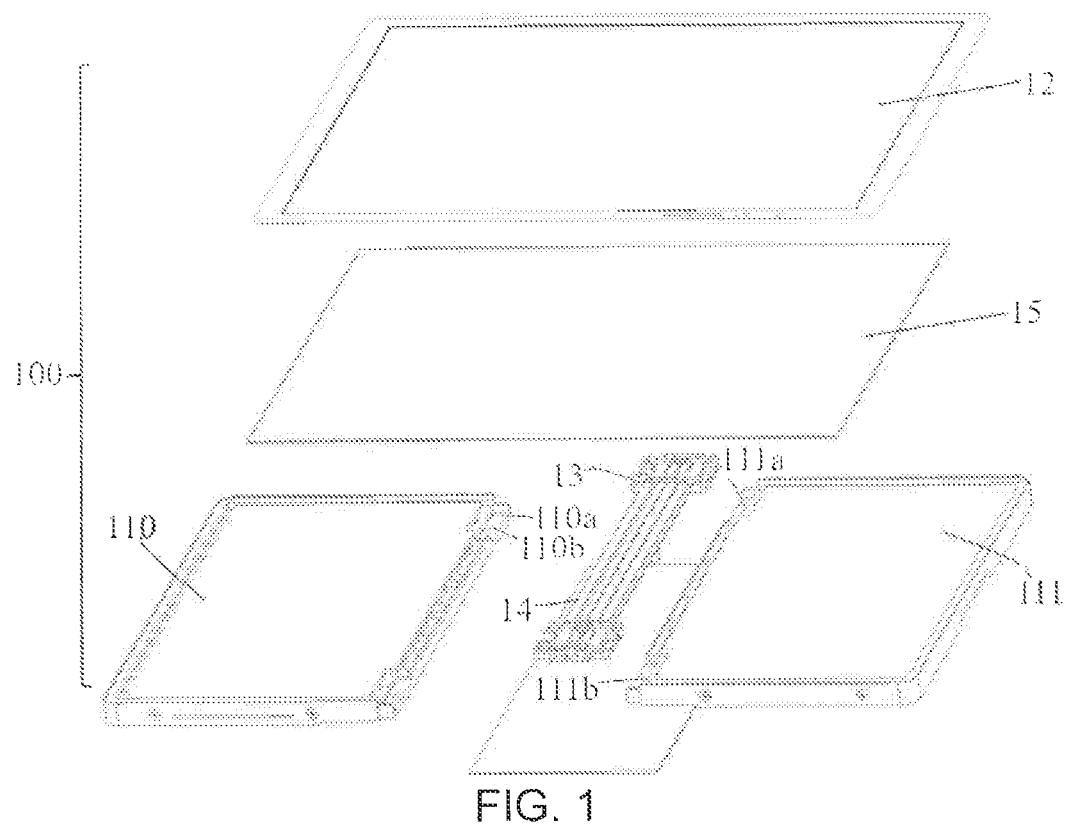
FIG. 1 is an exploded view of a folding display device according to a first embodiment of the present disclosure.

The technical solutions in the embodiments of the present disclosure will be clearly and completely described in the following with reference to the accompanying drawings. It is apparent that the described embodiments are only a part of the embodiments of the present disclosure, and not all of the embodiments. All other embodiments obtained by a person skilled in the art based on the embodiments of the present disclosure without creative efforts are within the scope of the present disclosure.

An embodiment of the present disclosure provides a folding display device that is a folding organic light emitting diode display panel. The folding display device includes a first support frame, a second support frame, a flexible display panel, a connecting assembly, and a rotating shaft assembly. The rotating shaft assembly is rotatably connected between the first support frame and the second support frame through the connecting assembly, the flexible display panel is fixed on the first support frame and the second support frame and covers the rotating shaft assembly, and the rotating shaft assembly includes 2N+2 cylindrical rotating shafts. 2N+2 cylindrical rotating shafts of the folding display device in a flattened state are arranged side by side and two adjacent cylindrical rotating shafts are in contact with each other. When the first support frame and the second support frame are rotated to be in two parallel opposite planes and the folding display device is in an externally bent state, 2N+2 cylindrical rotating shafts are divided into a first layer and a second layer stacked with each other, the second layer has N cylindrical rotating shafts arranged side by side, the first layer has N+2 cylindrical rotating shafts arranged side by side, two adjacent cylindrical rotating shafts of the first layer are in contact with each other, N cylindrical rotating shafts of the second layer are stacked on N+2 cylindrical rotating shafts of the first layer and support the flexible display panel corresponding to the rotating shaft assembly.

The folding display device of the embodiment includes 2N+2 cylindrical rotating shafts. 2N+2 cylindrical rotating shafts of the folding display device in a flattened state are arranged side by side and two adjacent cylindrical rotating shafts are in contact with each other. When the folding display device is in an externally bent state, 2N+2 cylindrical rotating shafts are divided into a first layer and a second layer stacked with each other, the first layer has N+2 cylindrical rotating shafts arranged side by side, the second layer has N cylindrical rotating shafts arranged side by side, N cylindrical rotating shafts of the second layer are stacked on N+2 cylindrical rotating shafts of the first layer. When the folding display device changes between the flattened state and the externally bent state, a change of a length of a corresponding flexible display panel is reduced, to avoid the flexible display panel being excessively elongated, thereby preventing the flexible display panel from being damaged by excessive stress.

It is noted that the folding display device mentioned in the specification of the present application is in an externally bent state, that is, the first support frame and the second support frame are rotated to be in two parallel opposite planes, and a flexible display panel portion supported by the first support frame and a flexible display panel portion supported by the second support frame are opposite each other.

The above scheme will be described below in conjunction with specific embodiments.

Figure 2:
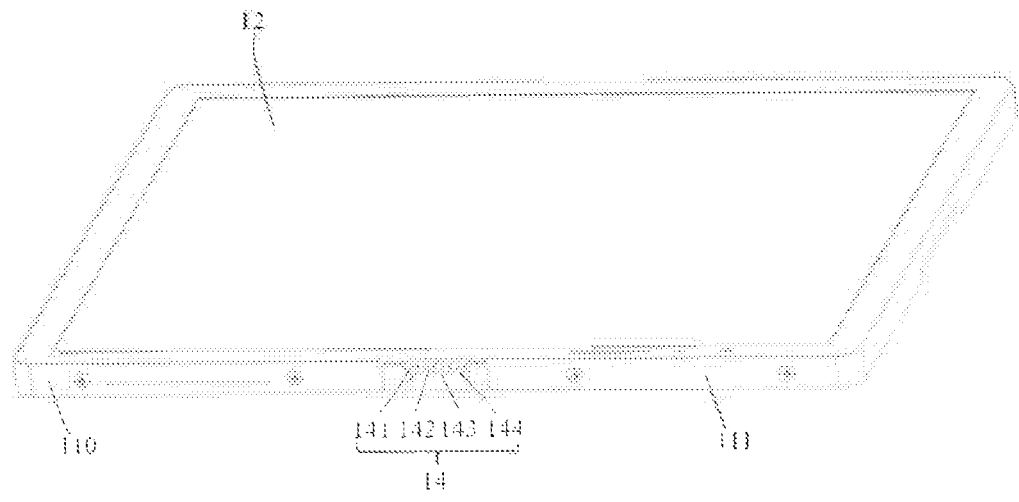
FIG. 2 is a schematic view illustrating a flattened state of the folding display device illustrated in FIG. 1.
Figure 3:
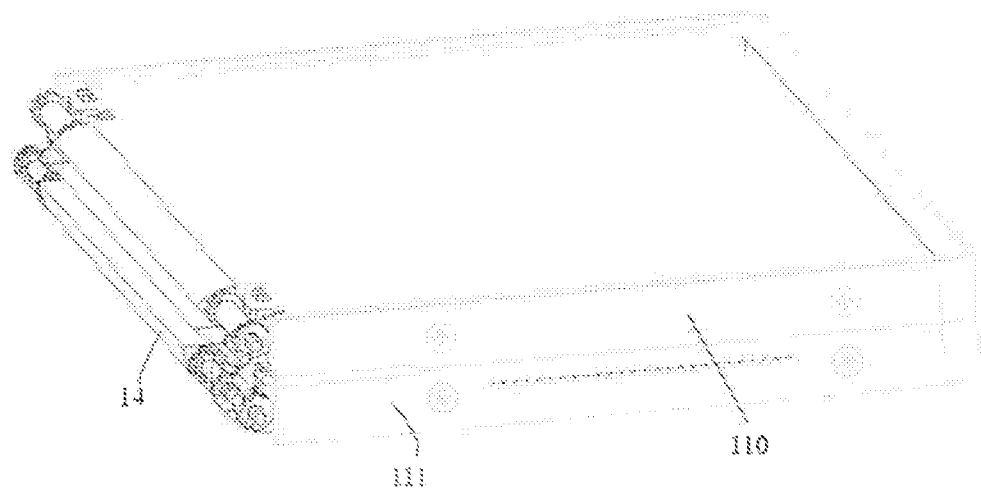
FIG. 3 is a schematic view illustrating a connection of a rotating shaft assembly, a first support frame, a second support frame, and a connecting assembly in an externally bent state of the folding display device illustrated in FIG. 1.
Figure 4:
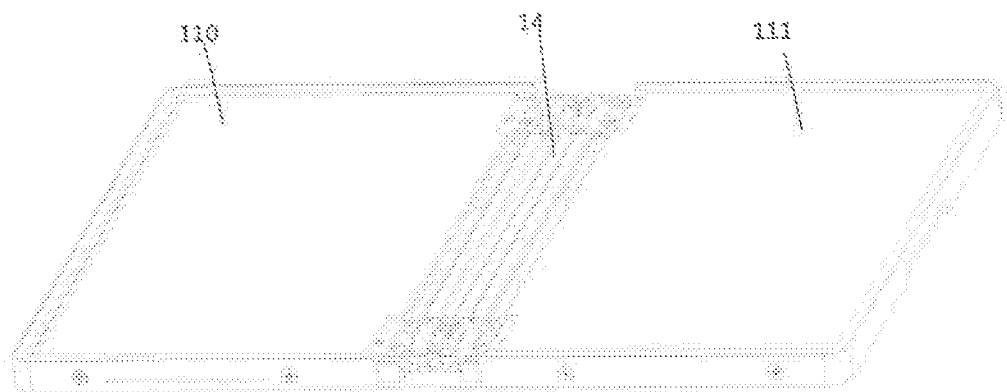
FIG. 4 is a schematic view illustrating a connection of a rotating shaft assembly, a first support frame, a second support frame, and a connecting assembly in the flattened state of the folding display device illustrated in FIG. 1.

Referring to FIG. 1 to FIG. 4, FIG. 1 is an exploded view of a folding display device according to a first embodiment of the present disclosure, FIG. 2 is a schematic view illustrating a flattened state of the folding display device illustrated in FIG. 1, FIG. 3 is a schematic view illustrating a connection of a rotating shaft assembly, a first support frame, a second support frame, and a connecting assembly in an externally bent state of the folding display device illustrated in FIG. 1, and FIG. 4 is a schematic view illustrating a connection of a rotating shaft assembly, a first support frame, a second support frame, and a connecting assembly in the flattened state of the folding display device illustrated in FIG. 1.

A folding display device 100 includes a first support frame 110, a second support frame 111, a flexible display panel 12, a connecting assembly 13, a rotating shaft assembly 14, and a metal sheet 15.

As shown in FIG. 1, the first support frame 110 and the second support frame 111 are middle frames. The first support frame 110 and the second support frame 111 are the same. The first support frame 110 and the second support frame 111 each have a support plane to support the flexible display panel 12 on the metal sheet 15. The first support frame 110 and the second support frame 111 are oppositely disposed. The first support frame 110 has two first fixing slots 110a and a third connecting hole 110b disposed in the first fixing slot 110a. The second support frame 111 has two second fixing grooves 111a and a fourth connecting hole 111b provided in the second fixing groove 111a.

The flexible display panel 12 includes a flexible substrate and an organic light emitting diode array layer disposed on the flexible substrate. The flexible display panel 12 is fixed to the metal sheet 15 by an optically transparent adhesive. The metal sheet 15 serves on one hand for supporting the flexible display panel 12 and ensures high flatness of the flexible display panel 12, and on another hand for ensuring that a length of the flexible display panel 12 does not change during folding, because the metal sheet 15 is not stretched and can assist a cylindrical rotating shaft in the rotating shaft assembly 14 to be divided into two layers from one layer or from two layers to one layer during folding. The metal piece 15 has a thickness of 40 μm±5 μm. The metal sheet 15 is made of stainless steel or other metal material having high strength and being difficult to be stretched.

Figure 5:
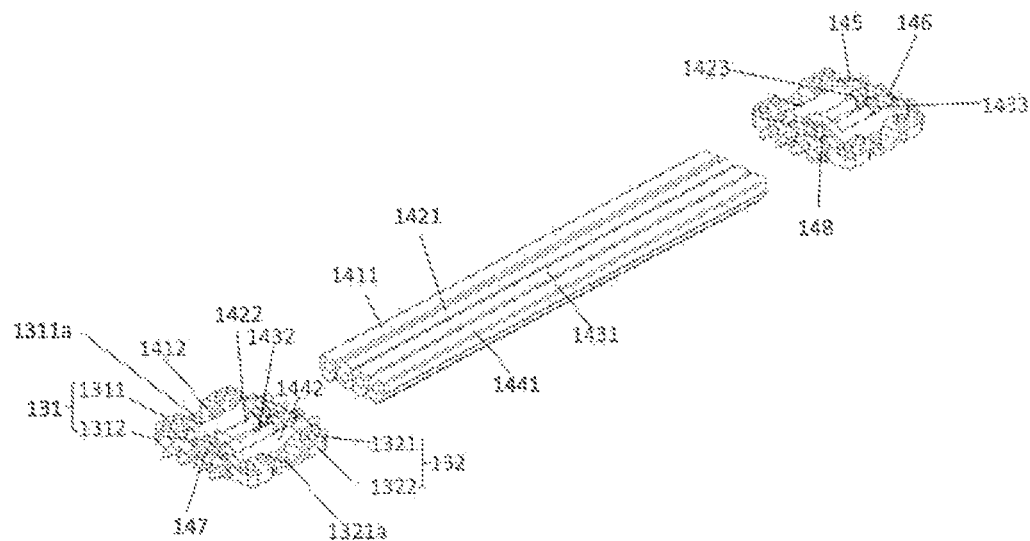
FIG. 5 is a schematic view of the rotating shaft assembly and the connecting assembly of the folding display device illustrated in FIG. 1.

Referring to FIG. 5, FIG. 5 is a schematic view of the rotating shaft assembly and the connecting assembly of the folding display device illustrated in FIG. 1. The connecting assembly 13 includes two sets of first connecting members 131 and two sets of second connecting members 132. Each set of the first connecting members 131 includes a first connecting component 1311 and two second connecting components 1312, two ends of the first connecting component 1311 are detachably and fixedly connected to the two second connecting components 1312, respectively, a middle of the first connecting component 1311 is detachably and fixedly connected to the first support frame 110, the two second components 1312 of each set of the first connecting members 131 are rotatably connected to one of the transmission rotating shafts of the cylindrical rotating shaft. Each set of second connecting members 132 includes a third connecting component 1321 and two fourth connecting component 1322. Two ends of the third connecting component 1321 are detachably and fixedly connected to the two fourth connecting components 1322, respectively, a middle of the third connecting component 1321 is detachably and fixedly connected to the second support frame 111. The two fourth components 1322 of each set of the second connecting members 132 are rotatably connected to another of the transmission rotating shafts of the cylindrical rotating shaft.

Specifically, the first connecting component 1311 includes two first connecting planes, a second connecting plane, and two vertical planes connecting the second connecting plane and the two first connecting planes. A vertical plane connects the first connecting plane and the second connecting plane, and another vertical plane connects another first connecting plane and another second connecting plane. The two first connecting planes are symmetrically located on either side of the second connecting plane and parallel to the second connecting plane. The second connecting component 1312 includes a connecting table and a lug on a side of the connecting table. A middle of the first connecting component 1311 has a first connecting hole 1311a. That is, the first connecting hole 1311a is disposed on the second connecting plane. Two sets of the first connecting members 131 are respectively disposed in the two first fixing slots 110a and pass through the first connecting hole 1311a and the third connecting hole 110b by bolting through to detachably and fixedly connect the first connecting member 131 and the first support frame 110. A fifth connecting hole is disposed on the two first connecting planes of the same first connecting component 1311. Correspondingly, the second connecting component 1312 is provided with a sixth connecting hole and passes through the fifth connecting hole and the sixth connecting hole by bolting through to connect the second connecting component 1312 and the first connecting component 1311. A seventh connecting hole is disposed on the lug of the second connecting component 1312, and one end of the driving shaft is inserted into the seventh connecting hole to connect a cylindrical rotating shaft to the first support frame 110. The third connecting component 1321 is the same as the first connecting component 1311, and the fourth connecting component 1322 is the same as the first connecting component 1312 and will not be described in detail herein. A middle of the third connecting component 1321 has a second connecting hole 1321a, two sets of the second connecting members 132 are respectively disposed in the two second fixing slots 111a and pass through the second connecting hole 1321a and the fourth connecting hole 11b by bolting through to detachably and fixedly connect the second connecting member 132 and the second support frame 111.

Referring to FIG. 2 and FIG. 5, the rotating shaft assembly 14 includes a first cylindrical rotating shaft 141, a second cylindrical rotating shaft 142, a third cylindrical rotating shaft 143, and a fourth cylindrical rotating shaft 144. The first cylindrical rotating shaft 141 is rotatably connected with the first support frame 110. The fourth cylindrical rotating shaft 144 is rotatably connected to the second support frame 111. The first cylindrical rotating shaft 141 and the second cylindrical rotating shaft 142 are rotatably connected by a first connecting rod 145, the third cylindrical rotating shaft 143 and the fourth cylindrical rotating shaft 144 is rotatably connected by a second connecting rod 146, the second cylindrical rotating shaft 142 and the third cylindrical rotating shaft 143 are connected by an elastic connecting rod 147, and a first gear 1423 disposed on the second cylindrical rotating shaft 142 and a second gear 1433 disposed on the third cylindrical rotating shaft 143 abut each other. An elastic returning member 148 is further disposed between the second cylindrical rotating shaft 142 and the third cylindrical rotating shaft 143. The elastic returning member 148 is configured to pull the second cylindrical rotating shaft 142 located in the second layer back by the third cylindrical rotating shaft 143 when the folding display device 100 changes from the externally bent state to the flattened state, such that the first cylindrical rotating shaft 141, the second cylindrical rotating shaft 142, the third cylindrical rotating shaft 143, and the fourth cylindrical rotating shaft 144 are arranged side by side.

The first cylindrical rotating shaft 141, the second cylindrical rotating shaft 142, the third cylindrical rotating shaft 143, and the fourth cylindrical rotating shaft 144 may be a single cylindrical rotating shaft. Each cylindrical rotating shaft of the first cylindrical rotating shaft 141, the second cylindrical rotating shaft 142, the third cylindrical rotating shaft 143, and the fourth cylindrical rotating shaft 144 may include a hollow rotating shaft body and two transmission rotating shafts, an end of one of the transmission rotating shafts is inserted into a cavity of an end of the hollow rotating shaft body, and an end of another of the transmission shafts is inserted into a cavity of another end of the hollow rotating shaft body.

Figure 6:
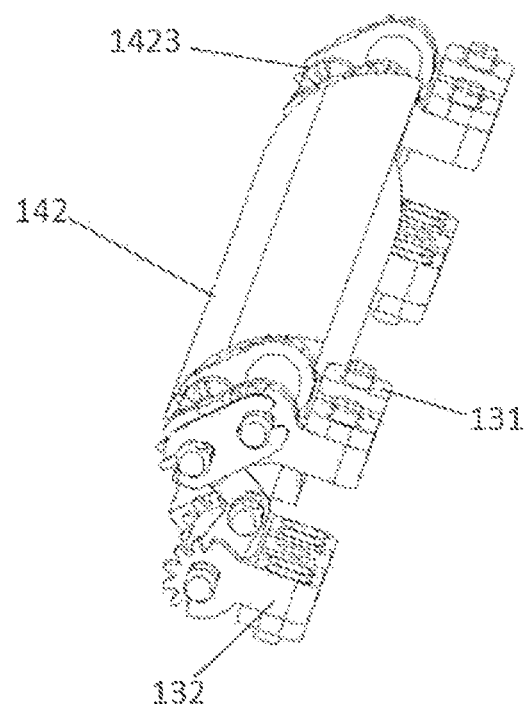
FIG. 6 is a schematic view of the rotating shaft assembly and the connecting assembly when the folding display device of FIG. 1 is in an externally bent state.

In details, referring to FIG. 5 and FIG. 6, FIG. 6 is a schematic view of the rotating shaft assembly and the connecting assembly when the folding display device of FIG. 1 is in an externally bent state. The first cylindrical rotating shaft 141 includes a first hollow rotating shaft body 1411 and two first transmission rotating shafts 1412 that are respectively inserted at two ends of the first hollow rotating shaft body 1411. The second cylindrical rotating shaft 142 includes a second hollow rotating shaft body 1421 and two second transmission rotating shafts 1422 that are respectively inserted at two ends of the second hollow rotating shaft body 1421. The third cylindrical rotating shaft 143 includes a third hollow rotating shaft body 1431 and two third transmission rotating shafts 1432 that are respectively inserted at two ends of the third hollow rotating shaft body 1431. The fourth cylindrical rotating shaft 144 includes a fourth hollow rotating shaft body 1441 and two fourth transmission rotating shafts 1442 that are respectively inserted at two ends of the fourth hollow rotating shaft body 1441.

The two transmission rotating shafts of one of the cylindrical rotating shafts and the first support frame 110 are rotatably connected by two sets of first connecting members 131, the two sets of first connecting members 131 are rotatably connected one-to-one with the two transmission rotating shafts of one of the cylindrical rotating shafts and connected to the first support frame 110 detachably and fixedly, the two transmission rotating shafts of another of the cylindrical rotating shafts and the second support frame 111 are rotatably connected by two sets of second connecting members 132, the two sets of second connecting members 132 are rotatably connected one-to-one with the two transmission rotating shafts of another of the cylindrical rotating shafts and connected to the second support frame 111 detachably and fixedly. In details, the two transmission rotating shafts of the first cylindrical rotating shaft 141 and the first support frame 110 are rotatably connected by two sets of first connecting members 131, the two sets of first connecting members 131 are rotatably connected one-to-one with the two transmission rotating shafts of the first cylindrical rotating shaft 141 and connected to the first support frame 110 detachably and fixedly. The two transmission rotating shafts of the fourth cylindrical rotating shaft 144 and the second support frame 111 are rotatably connected by two sets of second connecting members 132, the two sets of second connecting members 132 are rotatably connected one-to-one with the two transmission rotating shafts of the fourth cylindrical rotating shaft 144 and connected to the second support frame 111 detachably and fixedly.

Figure 7:
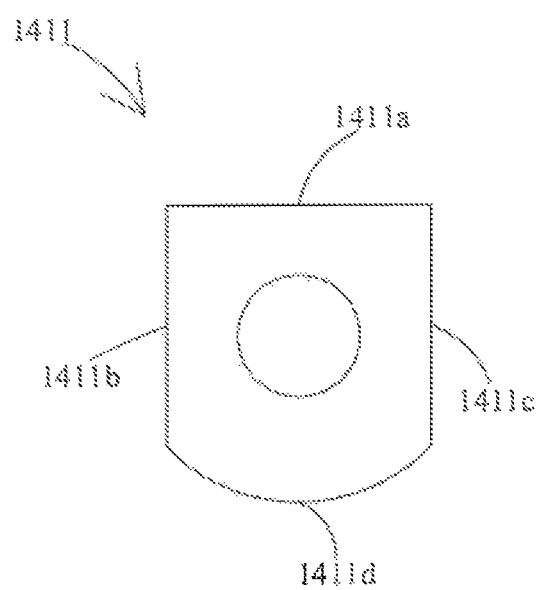
FIG. 7 is a schematic cross-sectional view along a longitudinal direction of a first rotating shaft body illustrated in FIG. 5.

In an embodiment of the present disclosure, each of the hollow rotating shaft bodies includes a first plane, a second plane, a third plane, and a curved surface. The curved surface is opposite to the first plane, the second plane is opposite to the third plane, the second plane is connected to an end of the first plane and the curved surface, and the third plane is connected to another end of the first plane and the curved surface. Referring to FIG. 7, a schematic cross-sectional view along a longitudinal direction of a first rotating shaft body illustrated in FIG. 5 is provided. The first hollow rotating shaft body 1411 includes a first plane 1411a, a second plane 1411b, a third plane 1411c, and a curved surface 1411d. The curved surface 1411d is opposite to the first plane 1411a, the second plane 1411b is opposite to the third plane 1411c, the second plane 1411b is connected to an end of the first plane 1411a and the curved surface 1411d, and the third plane 1411c is connected to another end of the first plane 1411a and the curved surface 1411d. The second rotating shaft body 1421, the third rotating shaft body 1431, and the fourth rotating shaft body 1441 are the same as the first rotating shaft body 1411 and will not be described in detail herein. The rotating shaft body is a hollow cylinder, and the rotating shaft body has the above structure, so that the cylindrical rotating shaft is more easily divided into two layers by one layer or converted into one layer by two layers.

When the folding display device is in the flattened state, the first rotating shaft body 1411, the second rotating shaft body 1421, the third rotating shaft body 1431, and the fourth rotating shaft body 1441 are arranged side by side and adjacent two rotating shaft bodies are in contact with each other. The first plane of the first rotating main body 1411, the curved surface of the second rotating main body 1421, the first plane of the third rotating main body 1431, and the first plane of the fourth rotating main body 1441 are located on the side close to the metal sheet 15, and the first support frame 110 and the second support frame 111 collectively support the metal sheet 15.

When the folding display device 100 is in the externally bent state, the first layer includes a first rotating shaft body 1441, a third rotating shaft body 1431, and a fourth rotating shaft body 1441 which are disposed side by side and adjacent two rotating shaft bodies are in contact with each other, and the second layer includes the second rotating shaft body 1442. The first plane of the second rotating shaft body 1442 is in contact with the first plane of the third rotating shaft body y 1443, and the curved surface of the second rotating shaft body 1442 supports the metal sheet 15. The first plane of the first rotating shaft body 1441, the first plane of the fourth rotating shaft body 1444, and the first plane of the third rotating shaft body 1443 are both located on a side close to the second rotating shaft body 1442.

Figure 8A:
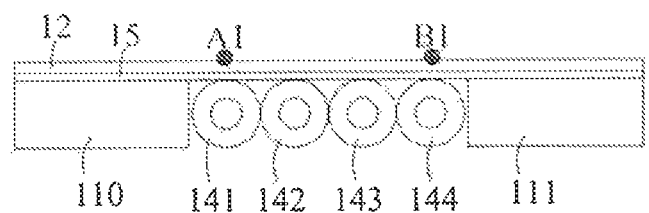
FIG. 8A is a schematic cross-sectional view illustrating a folding display device in a flattened state according to a second embodiment of the present disclosure.
Figure 8B:
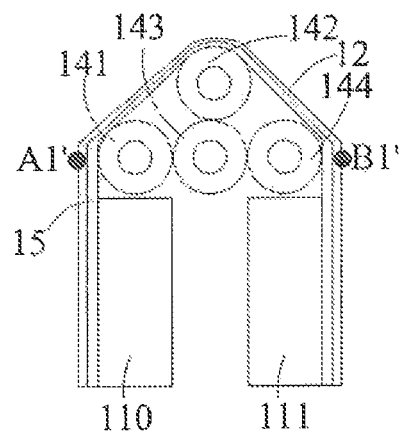
FIG. 8B is a schematic cross-sectional view illustrating a folding display device in an externally bent state according to a second embodiment of the present disclosure.

Referring to FIG. 8A and FIG. 8B, FIG. 8A is a schematic cross-sectional view illustrating a folding display device in a flattened state according to a second embodiment of the present disclosure, and FIG. 8B is a schematic cross-sectional view illustrating a folding display device in an externally bent state according to a second embodiment of the present disclosure. The folding display device of the second embodiment of the present application is substantially similar to the folding display device of FIG. 1, except that the first rotating shaft body of the first cylindrical rotating shaft 141, the second rotating shaft body of the second cylindrical rotating shaft 142, the third rotating shaft body of the third cylindrical rotating shaft 143, and the fourth rotating shaft body of the fourth cylindrical rotating shaft 144 are all hollow cylinders, and each hollow cylinder has a radius r.

When the folding display device is in the flattened state, the first cylindrical rotating shaft 141, the second cylindrical rotating shaft 142, the third cylindrical rotating shaft 143, and the fourth cylindrical rotating shaft 144 are arranged side by side and adjacent two cylindrical rotating shafts are in contact with each other. In addition, a length of the flexible display panel corresponding to the shaft assembly is A1B1, and the length of A1B1 is about 6r.

When the folding display device is in the externally bent state, the first cylindrical rotating shaft 141, the third cylindrical rotating shaft 143, and the fourth cylindrical rotating shaft 144 are the first layer, and the second cylindrical rotating shaft 142 is stacked on the third cylindrical rotating shaft 143. In this case, the length of the flexible display panel corresponding to the rotating shaft assembly is A1'B1', and the length of A1'B1' is about r, that is, the length of A1'B1' is about 8.4r.

Figure 9:
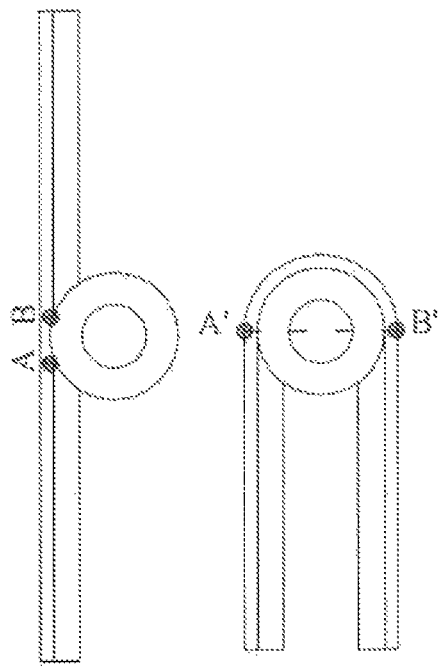
FIG. 9 is a schematic cross-sectional view illustrating a uniaxial folding display device in an externally bent state and a flattened state in the prior art.

When the folding display device changes from the flattened state to the externally bent state, the flexible display panel corresponding to the rotating shaft assembly has a varying length of 2.4r. Referring to FIG. 9, a uniaxial folding display device having a radius 3r in an externally bent state and a flattened state in the prior art is provided. In the flattened state, the length of the flexible display panel corresponding to a single rotating shaft is AB, AB is close to 0 (according to actual experience), and in the bent state, the length of the A'B' of the flexible display panel corresponding to a single rotating shaft is 3πr. That is, the length of change of the flexible display panel corresponding to the single rotating shaft when it is changed between the flattened state and the externally bent state is about 9.42r. It can be understood that, compared with the prior art, the folding display device of the embodiment of the present application can obviously prevent the flexible display panel from being stretched by excessive stress.

Figure 10A:
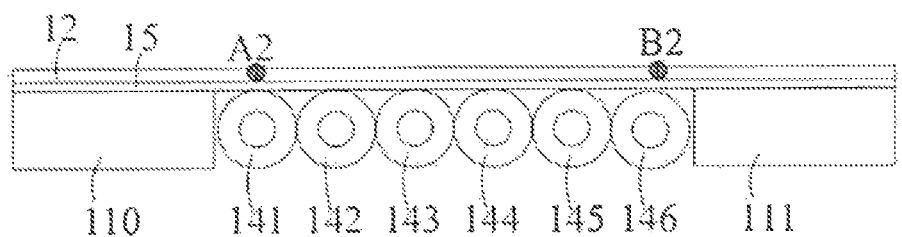
FIG. 10A is a schematic cross-sectional view illustrating a folding display device in a flattened state according to a third embodiment of the present disclosure.
Figure 10B:
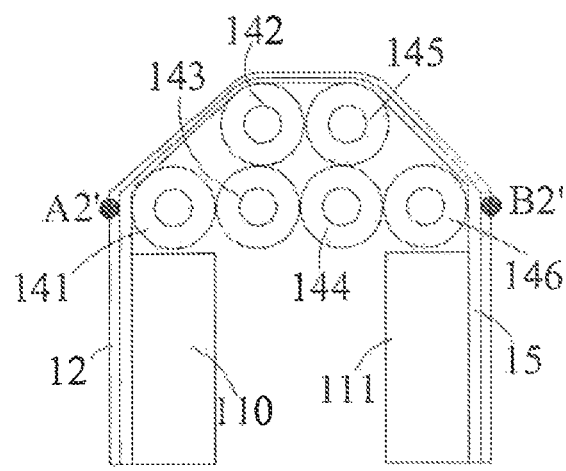
FIG. 10B is a schematic cross-sectional view illustrating a folding display device in an externally bent state according to a third embodiment of the present disclosure.

Referring to FIG. 10A and FIG. 10B, FIG. 10A is a schematic cross-sectional view illustrating a folding display device in a flattened state according to a third embodiment of the present disclosure, and FIG. 10B is a schematic cross-sectional view illustrating a folding display device in an externally bent state according to a third embodiment of the present disclosure. The folding display device of the third embodiment of the present application is substantially similar to the folding display device of the first embodiment, except that the rotating shaft assembly includes a first cylindrical rotating shaft 141, a second cylindrical rotating shaft 142, a third cylindrical rotating shaft 143, a fourth cylindrical rotating shaft 144, a fifth cylindrical rotating shaft 145, and a sixth cylindrical rotating shaft 146. The first cylinder rotating shaft 141 is rotatably connected to the first support frame 110, the sixth cylindrical rotating shaft 146 is rotatably connected to the second support frame 111, the first cylindrical rotating shaft 141 and the second cylindrical rotating shaft 142 is rotatably connected by a first connecting rod, the second cylindrical rotating shaft 142 and the third cylindrical rotating shaft 143 are rotatably connected by a first elastic connecting rod, a first gear (not shown) disposed on the second cylindrical rotating shaft 142 and a second gear (not shown) disposed on the third cylindrical rotating shaft 143 abut each other, the fifth cylindrical rotating shaft 145 and the sixth cylindrical rotating shaft 146 are rotatably connected by a second connecting rod, the fourth cylindrical rotating shaft 144 and the fifth cylindrical rotating shaft 145 are rotatably connected by a second elastic connecting rod, a third gear (not shown) disposed on the fourth cylindrical rotating shaft 144 and a fourth gear (not shown) disposed on the fifth cylindrical rotating shaft 145 abut each other, and the third cylindrical rotating shaft 143 and the fourth cylindrical rotating shaft 144 are rotatably connected by a third connecting rod. The second cylindrical rotating shaft 142 and the third cylindrical rotating shaft 143 are also connected by a first elastic returning member, and the fourth cylindrical rotating shaft 144 and the fifth cylindrical rotating shaft 145 are also connected by a second elastic returning member. The first elastic returning member and the second elastic returning member are configured to pull the second cylindrical rotating shaft 142 and the fifth cylindrical rotating shaft 145 located in the second layer back when the second cylindrical rotating shaft 142 is under the action of the third cylindrical rotating shaft 143 and the fifth cylindrical rotating shaft 145 is under the action of the fourth cylindrical rotating shaft 144 and when the folding display device 100 changes from the externally bent state to the flattened state. The rotating shaft bodies of the first cylindrical rotating shaft 141, the second cylindrical rotating shaft 142, the third cylindrical rotating shaft 143, the fourth cylindrical rotating shaft 144, the fifth cylindrical rotating shaft 145, and the sixth cylindrical rotating shaft 146 are all hollow cylinders, and each hollow cylinder has a radius r.

When the folding display device is in the flattened state, the first cylindrical rotating shaft 141, the second cylindrical rotating shaft 142, the third cylindrical rotating shaft 143, the fourth cylindrical rotating shaft 144, the fifth cylindrical rotating shaft 145, and the sixth cylindrical rotating shaft 146 are arranged side by side. The length of the flexible display panel corresponding to the rotating shaft assembly is A2B2, and A2B2 is about 10r.

When the folding display device is in the externally bent state, the first cylindrical rotating shaft 141, the third cylindrical rotating shaft 143, the fourth cylindrical rotating shaft 144 and the sixth cylindrical rotating shaft 146 are arranged side by side and adjacent two cylindrical rotating shafts are in contact with each other to constitute the first layer, and the second v rotating shaft 142 and the fifth cylindrical rotating shaft 145 are arranged side by side to constitute the second layer and are respectively located on the third cylindrical rotating shaft 143 and the fourth cylindrical rotating shaft 144. In addition, the length of the flexible display panel corresponding to the rotating shaft assembly is A2'B2', and A2'B2' is about $2r+6\sqrt{2}r$, that is, A2'B2' is about 10.4r.

When the folding display device changes from the flattened state to the externally bent state, the flexible display panel corresponding to the rotating shaft assembly has a variation length of 0.4r. Compared with the prior art, when a single rotating shaft having a radius of 3r is used, the length of change of the flexible display panel corresponding to a single rotating shaft between the flattened state and the externally bent state is about $3\pi r$, that is about 9.42r. It can be understood that, compared with the prior art, the folding display device of the embodiment of the present application can obviously prevent the flexible display panel from being stretched by excessive stress.

The description of the above embodiments is only for helping to understand the technical solutions of the present application and the core ideas thereof. It should be understood by those skilled in the art that the technical solutions described in the foregoing embodiments may be modified, or some of the technical features may be equivalently replaced. The modifications and substitutions do not depart from the scope of the technical solutions of the embodiments of the present application.

What is claimed is:

1. A folding display device, comprising:
a first support frame;
a second support frame;
a flexible display panel;
a connecting assembly; and
a rotating shaft assembly;
wherein the rotating shaft assembly is rotatably connected between the first support frame and the second support frame through the connecting assembly, the flexible display panel is fixed on the first support frame and the second support frame and covers the rotating shaft assembly, and the rotating shaft assembly comprises 2N+2 cylindrical rotating shafts;
wherein 2N+2 cylindrical rotating shafts of the folding display device in a flattened state are arranged side by side and two adjacent cylindrical rotating shafts are in contact with each other;
wherein when the first support frame and the second support frame are rotated to be in two parallel opposite planes and the folding display device is in an externally bent state, 2N+2 cylindrical rotating shafts are divided into a first layer and a second layer stacked with each other, the second layer has N cylindrical rotating shafts arranged side by side, the first layer has N+2 cylindrical rotating shafts arranged side by side, two adjacent cylindrical rotating shafts of the first layer are in contact with each other, N cylindrical rotating shafts of the second layer are stacked on N+2 cylindrical rotating shafts of the first layer and support the flexible display panel corresponding to the rotating shaft assembly, N is a positive integer greater than or equal to 1;
wherein the folding display device further comprises a metal sheet fixed to the first support frame and the second support frame and covering the rotating shaft assembly, and the flexible display panel is fixed to a surface of the metal sheet away from the rotating shaft assembly.

2. The folding display device according to claim 1, wherein the rotating shaft assembly comprises a first cylindrical rotating shaft, a second cylindrical rotating shaft, a third cylindrical rotating shaft, and a fourth cylindrical rotating shaft, the first cylindrical rotating shaft is rotatably connected with the first support frame, the fourth cylindrical rotating shaft is rotatably connected to the second support frame, the first cylindrical rotating shaft and the second cylindrical rotating shaft are rotatably connected by a first connecting rod, the third cylindrical rotating shaft and the fourth cylindrical rotating shaft is rotatably connected by a second connecting rod, the second cylindrical rotating shaft and the third cylindrical rotating shaft are connected by an elastic connecting rod, and a first gear disposed on the second cylindrical rotating shaft and a second gear disposed on the third cylindrical rotating shaft abut each other.

3. The folding display device according to claim 1, wherein the rotating shaft assembly comprises a first cylindrical rotating shaft, a second cylindrical rotating shaft, a third cylindrical rotating shaft, a fourth cylindrical rotating shaft, a fifth cylindrical rotating shaft, and a sixth cylindrical rotating shaft, the first cylinder rotating shaft is rotatably connected to the first support frame, the sixth cylindrical rotating shaft is rotatably connected to the second support frame, the first cylindrical rotating shaft and the second cylindrical rotating shaft is rotatably connected by a first connecting rod, the second cylindrical rotating shaft and the third cylindrical rotating shaft are rotatably connected by a first elastic connecting rod, a first gear disposed on the second cylindrical rotating shaft and a second gear disposed on the third cylindrical rotating shaft abut each other, the fifth cylindrical rotating shaft and the sixth cylindrical rotating shaft are rotatably connected by a second connecting rod, the fourth cylindrical rotating shaft and the fifth cylindrical rotating shaft are rotatably connected by a second elastic connecting rod, a third gear disposed on the fourth cylindrical rotating shaft and a fourth gear disposed on the fifth cylindrical rotating shaft abut each other, and the third cylindrical rotating shaft and the fourth cylindrical rotating shaft are rotatably connected by a third connecting rod.

4. The folding display device according to claim 1, wherein each of the cylindrical rotating shafts comprises a hollow rotating shaft body and two transmission rotating shafts, an end of one of the transmission rotating shafts is inserted into a cavity of an end of the hollow rotating shaft body, and an end of another of the transmission shafts is inserted into a cavity of another end of the hollow rotating shaft body.

5. The folding display device according to claim 4, wherein the two transmission rotating shafts of one of the cylindrical rotating shafts and the first support frame are rotatably connected by two sets of first connecting members, the two sets of first connecting members are rotatably connected one-to-one with the two transmission rotating shafts of one of the cylindrical rotating shafts and connected to the first support frame detachably and fixedly, the two transmission rotating shafts of another of the cylindrical rotating shafts and the second support frame are rotatably connected by two sets of second connecting members, the two sets of second connecting members are rotatably connected one-to-one with the two transmission rotating shafts of another of the cylindrical rotating shafts and connected to the second support frame detachably and fixedly, and the connecting assembly comprises the two sets of first connecting members and the two sets of second connecting members.

6. The folding display device according to claim 5, wherein each set of the first connecting members comprises a first connecting component and two second connecting components, each set of the second connecting members comprises a third connecting component and two fourth connecting components, two ends of the first connecting component are detachably and fixedly connected to the two second connecting components, respectively, a middle of the first connecting component is detachably and fixedly connected to the first support frame, two ends of the third connecting component are detachably and fixedly connected to the two fourth connecting components, respectively, a middle of the third connecting component is detachably and fixedly connected to the second support frame, the two second components of each set of the first connecting members are rotatably connected to one of the transmission rotating shafts of the cylindrical rotating shaft, and the two fourth components of each set of the second connecting members are rotatably connected to another of the transmission rotating shafts of the cylindrical rotating shaft.

7. The folding display device according to claim 6, wherein a middle of the first connecting component has a first connecting hole, a middle of the third connecting component has a second connecting hole, the first support frame has two first fixing slots and third connecting holes each disposed in each of the first fixing slots, the second support frame has two second fixing slots and fourth connecting holes each disposed in each of the second fixing slots, two sets of the first connecting members are respectively disposed in the two first fixing slots and pass through the first connecting hole and the third connecting hole by bolting through to detachably and fixedly connect the first connecting member and the first support frame, two sets of the second connecting members are respectively disposed in the two second fixing slots and pass through the second connecting hole and the fourth connecting hole by bolting through to detachably and fixedly connect the second connecting member and the second support frame.

8. The folding display device according to claim 4, wherein each of the hollow rotating shaft bodies comprises a first plane, a second plane, a third plane, and a curved surface, the curved surface is opposite to the first plane, the second plane is opposite to the third plane, the second plane is connected to an end of the first plane and the curved surface, and the third plane is connected to another end of the first plane and the curved surface.

9. The folding display device according to claim 4, wherein 2N+2 of the hollow rotating shaft bodies are hollow cylinders.

10. A folding display device, comprising:
a first support frame;
a second support frame;
a flexible display panel;
a connecting assembly; and
a rotating shaft assembly;
wherein the rotating shaft assembly is rotatably connected between the first support frame and the second support frame through the connecting assembly, the flexible display panel is fixed on the first support frame and the second support frame and covers the rotating shaft assembly, and the rotating shaft assembly comprises 2N+2 cylindrical rotating shafts;
wherein 2N+2 cylindrical rotating shafts of the folding display device in a flattened state are arranged side by side and two adjacent cylindrical rotating shafts are in contact with each other;
wherein when the first support frame and the second support frame are rotated to be in two parallel opposite planes and the folding display device is in an externally bent state, 2N+2 cylindrical rotating shafts are divided into a first layer and a second layer stacked with each other, the second layer has N cylindrical rotating shafts arranged side by side, the first layer has N+2 cylindrical rotating shafts arranged side by side, two adjacent cylindrical rotating shafts of the first layer are in contact with each other, N cylindrical rotating shafts of the second layer are stacked on N+2 cylindrical rotating shafts of the first layer and support the flexible display panel corresponding to the rotating shaft assembly, N is a positive integer greater than or equal to 1.

11. The folding display device according to claim 10, wherein the rotating shaft assembly comprises a first cylindrical rotating shaft, a second cylindrical rotating shaft, a third cylindrical rotating shaft, and a fourth cylindrical rotating shaft, the first cylindrical rotating shaft is rotatably connected with the first support frame, the fourth cylindrical rotating shaft is rotatably connected to the second support frame, the first cylindrical rotating shaft and the second cylindrical rotating shaft are rotatably connected by a first connecting rod, the third cylindrical rotating shaft and the fourth cylindrical rotating shaft is rotatably connected by a second connecting rod, the second cylindrical rotating shaft and the third cylindrical rotating shaft are connected by an elastic connecting rod, and a first gear disposed on the second cylindrical rotating shaft and a second gear disposed on the third cylindrical rotating shaft abut each other.

12. The folding display device according to claim 10, wherein the rotating shaft assembly comprises a first cylindrical rotating shaft, a second cylindrical rotating shaft, a third cylindrical rotating shaft, a fourth cylindrical rotating shaft, a fifth cylindrical rotating shaft, and a sixth cylindrical rotating shaft, the first cylinder rotating shaft is rotatably connected to the first support frame, the sixth cylindrical rotating shaft is rotatably connected to the second support frame, the first cylindrical rotating shaft and the second cylindrical rotating shaft is rotatably connected by a first connecting rod, the second cylindrical rotating shaft and the third cylindrical rotating shaft are rotatably connected by a first elastic connecting rod, a first gear disposed on the second cylindrical rotating shaft and a second gear disposed on the third cylindrical rotating shaft abut each other, the fifth cylindrical rotating shaft and the sixth cylindrical rotating shaft are rotatably connected by a second connecting rod, the fourth cylindrical rotating shaft and the fifth cylindrical rotating shaft are rotatably connected by a second elastic connecting rod, a third gear disposed on the fourth cylindrical rotating shaft and a fourth gear disposed on the fifth cylindrical rotating shaft abut each other, and the third cylindrical rotating shaft and the fourth cylindrical rotating shaft are rotatably connected by a third connecting rod.

13. The folding display device according to claim 10, wherein each of the cylindrical rotating shafts comprises a hollow rotating shaft body and two transmission rotating shafts, an end of one of the transmission rotating shafts is inserted into a cavity of an end of the hollow rotating shaft body, and an end of another of the transmission shafts is inserted into a cavity of another end of the hollow rotating shaft body.

14. The folding display device according to claim 13, wherein the two transmission rotating shafts of one of the cylindrical rotating shafts and the first support frame are rotatably connected by two sets of first connecting members, the two sets of first connecting members are rotatably connected one-to-one with the two transmission rotating shafts of one of the cylindrical rotating shafts and connected to the first support frame detachably and fixedly, the two transmission rotating shafts of another of the cylindrical rotating shafts and the second support frame are rotatably connected by two sets of second connecting members, the two sets of second connecting members are rotatably connected one-to-one with the two transmission rotating shafts of another of the cylindrical rotating shafts and connected to the second support frame detachably and fixedly, and the connecting assembly comprises the two sets of first connecting members and the two sets of second connecting members.

15. The folding display device according to claim 14, wherein each set of the first connecting members comprises a first connecting component and two second connecting components, each set of the second connecting members comprises a third connecting component and two fourth connecting components, two ends of the first connecting component are detachably and fixedly connected to the two second connecting components, respectively, a middle of the first connecting component is detachably and fixedly connected to the first support frame, two ends of the third connecting component are detachably and fixedly connected to the two fourth connecting components, respectively, a middle of the third connecting component is detachably and fixedly connected to the second support frame, the two second components of each set of the first connecting members are rotatably connected to one of the transmission rotating shafts of the cylindrical rotating shaft, and the two fourth components of each set of the second connecting members are rotatably connected to another of the transmission rotating shafts of the cylindrical rotating shaft.

16. The folding display device according to claim 15, wherein a middle of the first connecting component has a first connecting hole, a middle of the third connecting component has a second connecting hole, the first support frame has two first fixing slots and third connecting holes each disposed in each of the first fixing slots, the second support frame has two second fixing slots and fourth connecting holes each disposed in each of the second fixing slots, two sets of the first connecting members are respectively disposed in the two first fixing slots and pass through the first connecting hole and the third connecting hole by bolting through to detachably and fixedly connect the first connecting member and the first support frame, two sets of the second connecting members are respectively disposed in the two second fixing slots and pass through the second connecting hole and the fourth connecting hole by bolting through to detachably and fixedly connect the second connecting member and the second support frame.

17. The folding display device according to claim 13, wherein each of the hollow rotating shaft bodies comprises a first plane, a second plane, a third plane, and a curved surface, the curved surface is opposite to the first plane, the second plane is opposite to the third plane, the second plane is connected to an end of the first plane and the curved surface, and the third plane is connected to another end of the first plane and the curved surface.

18. The folding display device according to claim 13, wherein 2N+2 of the hollow rotating shaft bodies are hollow cylinders.

* * * * *